United States Patent [19]
Hiltebeitel et al.

[11] Patent Number: 5,901,093
[45] Date of Patent: May 4, 1999

[54] REDUNDANCY ARCHITECTURE AND METHOD FOR BLOCK WRITE ACCESS CYCLES PERMITTING DEFECTIVE MEMORY LINE REPLACEMENT

[75] Inventors: Nathan Rafael Hiltebeitel, Essex Jct.; Robert Tamlyn; Steven William Tomashot, both of Jericho; Thomas Walter Wyckoff, Jeffersonville, all of Vt.

[73] Assignee: International Business Machines Corporation, Armonk, N.Y.

[21] Appl. No.: 08/464,044

[22] Filed: Jun. 5, 1995

Related U.S. Application Data

[63] Continuation of application No. 07/703,077, May 20, 1991, abandoned.

[51] Int. Cl.$^6$ .................................................. G11C 7/00
[52] U.S. Cl. ....................... 365/200; 365/195; 365/200
[58] Field of Search ................. 365/189.02, 189.07, 365/195, 200, 230.02, 230.06; 371/10.1, 10.2, 10.3; 307/262.1, 219, 441, 449, 463

[56] References Cited

U.S. PATENT DOCUMENTS

| | | | |
|---|---|---|---|
| 4,310,901 | 1/1982 | Harding et al. | 365/200 |
| 4,380,066 | 4/1983 | Spencer et al. | 371/10.3 |
| 4,571,707 | 2/1986 | Watanabe | 365/200 |
| 4,601,019 | 7/1986 | Shah et al. | 365/200 |
| 4,601,031 | 7/1986 | Walker et al. | 371/10.3 |
| 4,689,494 | 8/1987 | Chen et al. | 307/202.1 |
| 4,691,301 | 9/1987 | Anderson | 365/200 |
| 4,791,615 | 12/1988 | Pelley, III et al. | 365/200 |
| 4,807,189 | 2/1989 | Pinkham et al. | 365/189.05 |
| 4,807,191 | 2/1989 | Flannagan | 371/10.3 |
| 4,827,452 | 5/1989 | Toyama et al. | 365/200 |
| 4,829,480 | 5/1989 | Seo | 365/200 |
| 4,837,747 | 6/1989 | Dosaka et al. | 371/10.3 |
| 4,849,938 | 7/1989 | Furutani et al. | 371/10.3 |
| 4,858,192 | 8/1989 | Tatsumi et al. | 365/200 |
| 5,134,616 | 7/1992 | Barth, Jr. et al. | 371/10.3 |

FOREIGN PATENT DOCUMENTS

| | | |
|---|---|---|
| 3537015 | 5/1986 | Germany . |
| 61-99999 | 5/1986 | Japan . |
| 63-79300 | 4/1988 | Japan . |
| 2165971 | 4/1986 | United Kingdom . |

OTHER PUBLICATIONS

Translation of Office Action for Japanese Patent Application No. 99750/1992 mailed Oct. 4, 1994.
Translation of Japanese Patent Application No. 99999/1986 entitled "Semiconductor Memory Device".

*Primary Examiner*—Jack A. Lane
*Attorney, Agent, or Firm*—Mark F. Chadurjian; Robert A. Walsh

[57] ABSTRACT

An invention is disclosed which implements bit line redundancy in a memory module, such as a dynamic random access memory (DRAM), in accordance with a block write operation. The block write operation is commonly used in dual port RAMs, sometimes referred to as video random access memories (VRAM). Specifically, a block write operation allows a plurality of bits of data to be written to a plurality of adjacent bit lines defined by a column address. The precise combination of adjacent bit lines selected by the column address is designated by an address mask. The invention provides a memory module with a redundant bit decoder that incorporates an address masking function into the redundant bit decoder during block write operations and also bypasses a masking function during normal read and write operations. This redundant bit decoder allows a single redundant bit line to replace any single defective bit line of the selected group of block write bit lines. It eliminates the need for replacing all the selected bit lines and, thereby, saves silicon area and maximizes the utilization of available redundant bit elements.

13 Claims, 5 Drawing Sheets

REDUNDANCY ARCHITECTURE AND METHOD FOR BLOCK WRITE ACCESS CYCLES PERMITTING DEFECTIVE MEMORY LINE REPLACEMENT

This is a continuation of application Ser. No. 07/703,077 filed May 20, 1991, now abandoned.

BACKGROUND OF THE INVENTION

1. Technical Field

The invention relates generally to the field of dynamic random access memory (DRAM) design, and more particularly to a DRAM architecture that provides a redundant bit decoder for particular use in block write operations. The decoder achieves efficient use of fabrication area.

2. Background Art

From the very early stages of DRAM development in the 1970's, designers have recognized the need for integral error recovery circuitry. That is, given the large number of processing steps needed to make a memory chip, and given the large number of discrete transistor-capacitor memory cells to be fabricated, from a practical standpoint it is inevitable that at least some memory cells will not function properly.

Semiconductor memories generally take the form of a memory array of elements which are accessed or selected by row and column decoders in order to address a particular memory element. A sense amplifier formed on the semiconductor chip is used to sense the memory state of the selected memory element when addressed. Typically, each memory element is connected to a bit-line. Each bit-line can be selectively coupled to a data-line, which in turn can be connected to the sense amplifier.

As the density of the memory array on a semiconductor chip increases, it becomes increasingly difficult to maintain high production yields and memory chip reliability. A prior art solution has been to provide redundant memory elements or bits in the form of additional rows or columns on the semiconductor chip which are to be substituted for defective elements in a faulty area of the memory array. U.S. Pat. No. 4,601,031 to Walker et al., U.S. Pat. No. 4,689,494 to Chen et al., U.S. Pat. No. 4,691,301 to Anderson, U.S. Pat. No. 4,791,615 to Pelley, III, et al., U.S. Pat. No. 4,827,452 to Toyama et al., U.S. Pat. No. 4,829,480 to Seo, U.S. Pat. No. 4,837,747 to Dosaka et al., U.S. Pat. No. 4,849,938 to Furutani et al., U.S. Pat. No. 4,858,192 to Tatsumi et al., and Japanese Pat. Publication No. 63-79300 are representative of such prior art.

Semiconductor memories are frequently characterized as being divided into sub-arrays or blocks of memory cells. Such block architecture is often chosen to reduce power consumption. Prior art systems, such as the U.S. Pat. No. 4,601,019 to Shah, et al., include a block architecture employing separate redundant blocks of memory elements for each sub-array. A problem with such architecture is that the redundancy is not efficiently implemented in the design, because the redundant rows and used can replace defective rows and columns in only the same sub-array as that of the redundant rows and columns. As a result, the total number of redundant elements required to provide memory reliability is greatly multiplied.

U.S. Pat. No. 4,807,191 to Flannagan proposes a solution to this problem by providing a block of redundant columns for each stack of sub-arrays in the memory module. Each block of redundant columns includes groups of four contiguous columns. Any one of these groups of four contiguous columns replaces a group of four contiguous columns containing at least one defective column found in any of the sub-arrays in the stack. When a defective column is identified, the defective column is replaced, along with the three other columns in the group, whether or not they are defective. As a result, four contiguous columns in one of the sub-arrays is replaced by four contiguous columns in the redundant sub-array. Flannagan states that the memory architecture could be modified to have only a single defective column replaced by a single redundant column, instead of always replacing four contiguous columns any time column redundancy is implemented.

Although the prior art methods described above are effective for use in normal DRAM read/write operations, the methods are inefficient for implementing redundancy in a DRAM during a block write operation. The block write operation is common to dual port RAMs, sometimes referred to as video RAMs (VRAMS). During a block write operation, data in an on-chip color register is to be written to a plurality of adjacent bit lines defined by a column address. For example, in a one megabit (1 Mb) memory module (256 Kb×4 VRAM), the address of four adjacent bit lines can be defined by column address bits A2–A8. The two least significant address bits A0–A1 are used only during the normal read/write operation of the memory module to select a single bit line. These address bits are replaced by four input data bits DQ0–DQ3 during the block write operation.

Normally these input data bits are used by a microprocessor coupled to the memory module to provide input data that is to be written into memory. However, during block write operation, the data bits DQ0–DQ3 are used as an address mask. More specifically, the data input bits determine which of the four column address locations decoded by address bits A2–A8 are intended to be loaded with video data during the block write cycle. The input data on DQ0 controls the write operation to the bit line normally accessed when A0 is in a low state (A0=0) and A1 is in a low state (A1=0); DQ1 controls the write operation to the bit line normally accessed when A0=1 and A1=0; DQ2 controls the write operation to the bit line normally accessed when A0=0 and A1=1; and, likewise, DQ3 controls the write operation to the bit line normally accessed when A0=1 and A1=1.

Accordingly, a need exists in the art for a memory module architecture that incorporates redundancy with a block write access capability. Moreover, there is a need in the art for a redundancy system that improves upon the production yields, memory reliability, and the area required for implementation in such a memory module.

SUMMARY OF THE INVENTION

It is thus an object of the invention to provide a redundancy system for a memory module that is accessed in a block write operation.

It is another object of the invention to combine the redundancy and the block write features in an area-efficient manner.

It is yet another object of the invention to provide a redundant bit decoder that incorporates an address masking function during block write operations and bypasses the masking function during normal read/write cycles.

The above and other objects of the invention are realized by a redundancy decoder comprising: a plurality of address inputs; a plurality of address mask inputs; a plurality of stored redundant address bits; first means for comparing all of said plurality of stored redundant address bits to respective ones of said plurality of address inputs during a first access mode, and for comparing some of said plurality of stored redundant address bits to respective ones of said plurality of address inputs during a second access mode; and second means for using remaining ones of said plurality of stored redundant address bits to select one of said plurality of address mask inputs during said second access mode. The redundancy decoder further comprises means for generating an output enable signal in response to a favorable comparison by said first means, and a means for selectively inhibiting the generation of the output enable signal in response to comparisons by the second comparing means. Furthermore, the redundancy decoder receives an input signal signifying a block write operation which allows a plurality of memory lines to be accessed simultaneously, and the inhibiting means is operative only in accordance with said block write input signal.

Another aspect of the invention comprises a memory module for accessing memory lines associated with input address bits and input mask bits. The module comprises: a plurality of memory lines accessed by input address bits; address mask means for receiving input mask bits and disabling selected ones of the memory lines from storing new data in accordance with said mask bits; redundancy decoder means for comparing input address bits to stored redundant address bits, and for using the stored redundant address bits to select the input mask bits, the redundancy decoder means generating an output enable signal; and redundant line means for replacing a defective memory line in response to the output enable signal. The redundancy decoder further comprises means for generating an output enable signal in response to a favorable comparison between the input address bits and the stored redundant address bits, and means for selectively inhibiting the generation of the output enable signal in accordance with said input mask bits the memory module further comprises means for receiving a block write input signal signifying a block write operation which allows a plurality of memory lines to be accessed simultaneously, and the inhibiting means is operative only in accordance with the block write input signal.

Yet another aspect of the invention comprises a memory module for accessing memory lines associated with input address bits and input mask bits. The module comprises a plurality of memory lines accessed by input address bits; address mask means for receiving input mask bits and disabling selected ones of the memory lines from storing new data in accordance with the mask bits; and redundancy decoder means for comparing input address bits to stored redundant address bits, and for using the stored redundant address bits to select the input mask bits. The redundancy decoder means generates an output enable signal, and further comprises means for selectively inhibiting the generation of the output enable signal in accordance with the input mask bits, means for generating the output enable signal in response to a favorable comparison between the input address bits and said stored redundant address bits, redundant line means for replacing a defective memory line in response to the output enable signal, and means for receiving a block write input signal signifying a block write operation which allows a plurality of memory lines to be accessed simultaneously, the inhibiting means being operative only in accordance with the block write input signal.

DESCRIPTION OF THE DRAWING

The foregoing and other structures and teachings of the invention will become more apparent from the following description of the best mode for carrying out the invention.

In the description to follow, reference will be made to the accompanying drawing, in which.

DESCRIPTION OF THE BEST MODE FOR CARRYING OUT THE INVENTION

Figure 1:
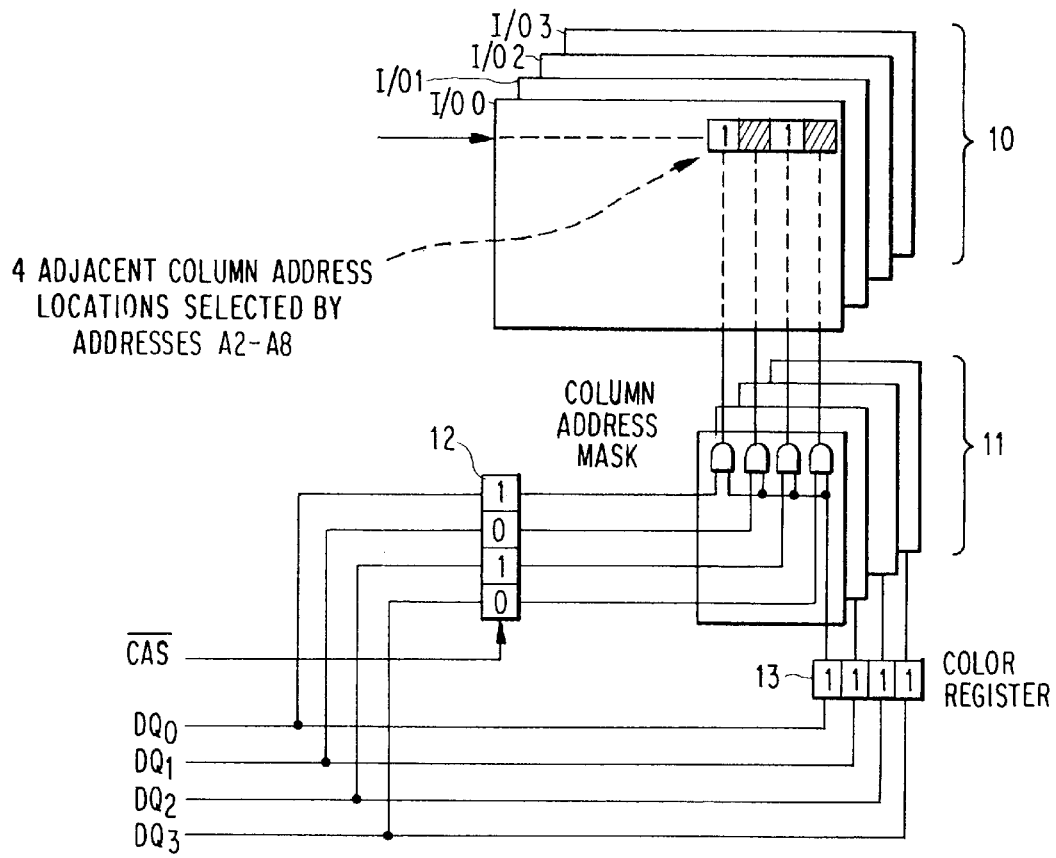
FIG. 1 is a block diagram of a typical block write operation.

As shown in FIG. 1, a block write operation typically involves loading of video data into a plurality of memory elements of a memory module 10. The video data is sent from a microprocessor (not shown) over data lines DQ0 . . . DQ3 and loaded into register 13. Typically the register is known as a color register and is loaded on a color register set cycle. This data may represent color information which is to be loaded into specific sections of the memory module 10. Each bit of register 13 is coupled to a respective portion of gating section 11. Each portion of the gating section comprises four AND gates coupled to the respective register bit in parallel. Each portion of gating section 11 corresponds to a separate section of memory module 10 which is divided into four sections: I/O 0 . . . I/O 3. The division of the memory module is not critical to the present invention; however, in a preferred embodiment, the memory module is a 1 Mb DRAM designated as a 256 Kb×4 memory module; that is, each section of the memory is composed of 256K bits of memory.

As briefly discussed above, the block write operation allows a plurality of memory elements to be selected for simultaneous loading of information. Accordingly, FIG. 1 shows four elements selected by address A2–A8. A similar selection of elements occurs in sections I/O 1–I/O 3 of memory module 10. Thus, a maximum number of 16 memory elements may be loaded during a block write operation. The block write feature allows contiguous portions of memory to be loaded in a relatively short time, which is most useful in video systems where the coloring or shading data used during the video operation calls for a plurality of contiguous sections of memory to be loaded with the same information.

A column address mask 12 is connected to data lines DQ0 . . . DQ3 and stores information during a cycle separate from the color register 13 set cycle. This information is used to enable selective ones of the AND gates in each portion of gating section 11. By using the address mask, selected ones of the plurality of contiguous memory elements will remain unchanged after the block write operation. Data corresponding to a 0 in the address mask will inhibit the corresponding AND gate; thus, the information stored in the associated memory element will not be overwritten by the data stored in color register 13.

Figure 2:
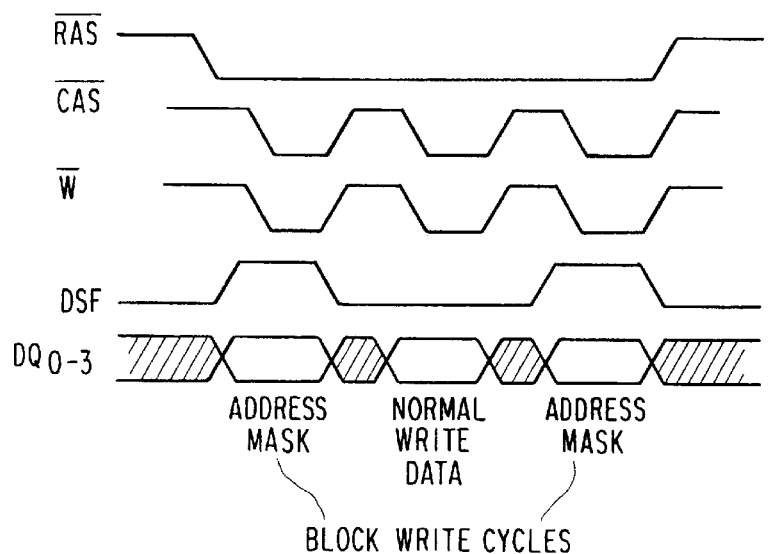
FIG. 2 is a timing diagram depicting the block write cycles.

FIG. 2 depicts a typical timing diagram of the block write operation. A row address strobe ($\overline{RAS}$) and a column address strobe ($\overline{CAS}$) define timing cycles for the sampling of a row address and a column address, respectively. Write enable ($\overline{W}$) is the input signal that designates a write operation. The designated special function (DSF) signal is sent by a microprocessor to the module and designates the special block write function, as will be described below. Data lines DQ0 . . . DQ3 are read as address mask data during the simultaneous low states of the $\overline{RAS}$, $\overline{CAS}$ and $\overline{W}$ signals, and the high state of the DSF signal. DQ0 . . . DQ3 are read as normal write data when $\overline{RAS}$, $\overline{CAS}$, $\overline{W}$ and DSF are all in the low state.

Figure 3:
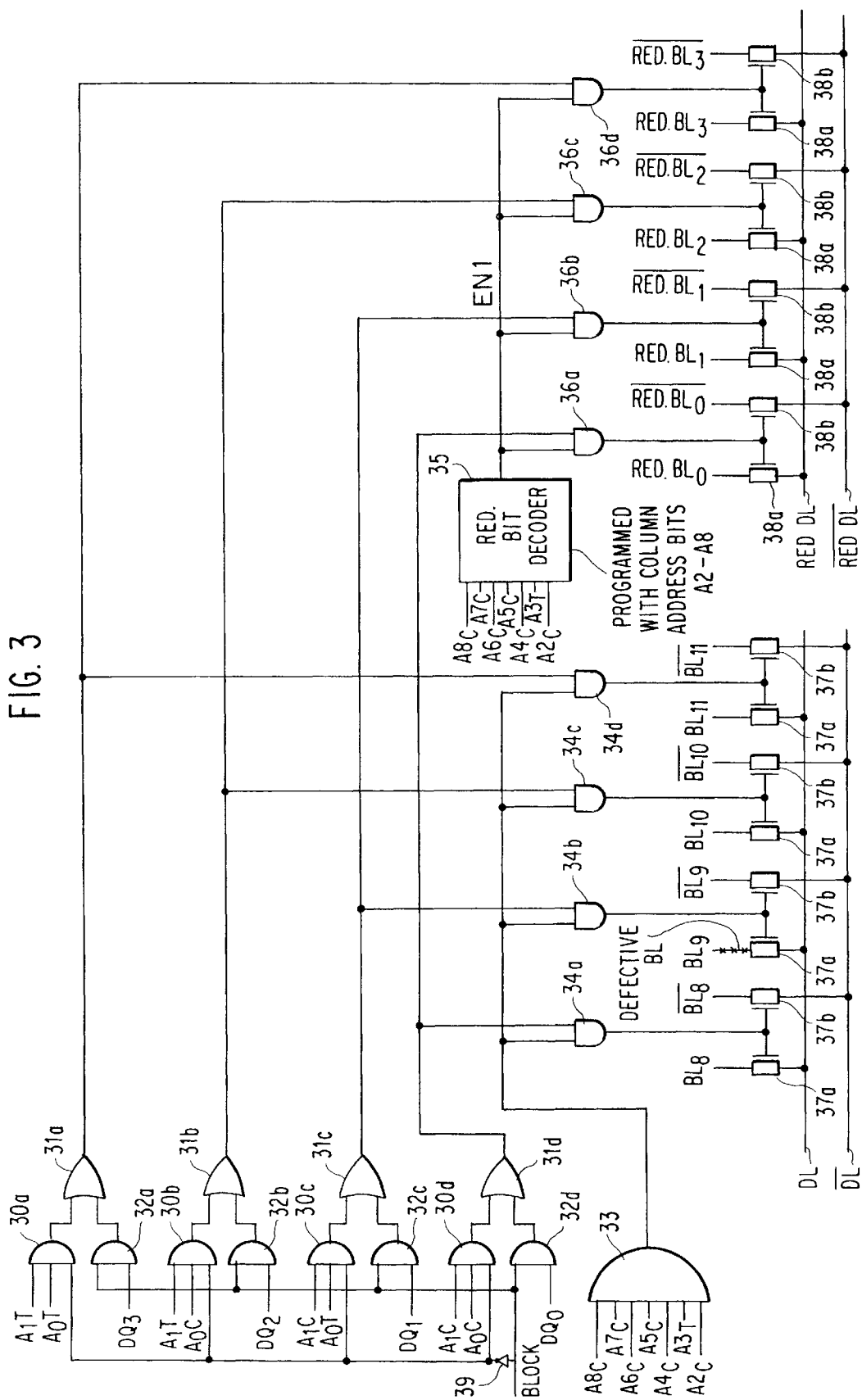
FIG. 3 is a schematic diagram of a memory module capable of block write access using redundancy architecture.

FIG. 3 depicts a known technique of implementing redundancy architecture with a block write operation in a memory module. Bit line pairs BL8 . . . BL11 are connected to memory elements (not shown) selected by addresses A2–A8. The particular address, depicted here by decoder 33 receiving inputs A2C, A3T, A4C . . . A8C, corresponds to A2–A8=0100000 which is the specific address that selects the group of memory elements corresponding to bit line pairs BL8 . . . B11. The bit line pairs are connected to global data lines DL via a pair of bit switches 37. A bit line pair is composed of a bit line (i.e., BL8), carrying data from its corresponding memory element, and a bit line carrying complementary data (i.e., $\overline{BL8}$). Similarly, the data line pair is composed of two lines for connection with the two lines of a bit line pair.

The least significant address bits A0 and A1 are received by AND gates 30, 30a . . . 30d. More specifically, AND gate 30a is enabled upon a reception of address bits A0 and A1 in their true or high states. During normal operation, the block write input signal, depicted as signal line BLOCK, is held low, and the AND gate 30a receives a high signal as an input from inverter 39. If the AND gate 30a is enabled, it outputs a high signal to OR gate 31a. This signal is received by AND gates 34d and 36d corresponding to bit line pair BL11 and redundant bit line pair REDBL3, respectively. The remaining AND gates 30b . . . 30d and OR gates 31b . . . 31d operate in a similar manner to select bit line pairs BL8 . . . BL10 and redundant bit line pairs REDBL0 . . . REDBL2 according to the states of input address bits A0 and A1. As described above, address bits A2–A8 select the group of bit line pairs, and address bits A0 and A1 select the individual bit line pair. The selection of the bit line pair enables the corresponding AND gates 34a . . . 34d, 36a . . . 36d, so that the associated bit switch pair 37a,b, 38a is activated to connect the bit line pair to the data line pair.

A redundant bit decoder 35 is programmed with the column address bits A2–A8 corresponding to the group having at least one defective bit line pair. As shown in the figure, bit line pair BL9 is defective. Accordingly, the stored address (A2–A8=0100000) of this column or group is stored in decoder 35. Redundant bit decoder 35 compares the input address bits A2–A8 with the stored address bits and generates an output upon a favorable comparison. This output is received by AND gates 36a . . . 36d as signal EN to enable one of the redundant bit line pairs REDBL0 . . . REDBL3 to be connected to redundant data line pair REDDL. The redundant bit line pair is selected by input address bits A0, A1, as described above.

During the block write operation, the BLOCK signal is held high and is input as first inputs to AND gates 32 . . . 32. The high BLOCK signal generates a low output signal from inverter 39 to disable AND gates 30 . . . 30. This has the effect of disabling the selection of individual bit line pairs BL8 . . . BL11 (or the corresponding redundant bit line pairs REDBL0 . . . REDBL3). The second inputs to AND gates 32 . . . 32 are shown as data lines DQ0 . . . DQ3. As described above, the data lines DQ0 . . . DQ3 are used as address mask bits during the block write operation. When one of the data lines is in a high state, the corresponding AND gate 32 sends an output signal through respective OR gate 31 to enable the associated and gates 34 and 36. These data inputs operate to select specific bit line pairs which are to receive the video data during the block write operation. That is, the enablement of the selected AND gate 34 or 36 will connect the corresponding bit line pair to the data line pair (or the corresponding redundant bit line pair to the redundant data line pair), thereby allowing the transmission of the video data input (from the microprocessor) to the selected memory element or elements via the global data line pairs.

As can be seen from FIG. 3, the defective bit line pair BL9 is replaced by a group of bit line pairs REDBL0 . . . REDBL3. Even though there is only a single defective bit line pair, this system requires the presence of four redundant bit line pairs and associated selection logic to serve as replacement. Although this method is manageable, it increases the fabrication area required to four times the number of redundant bit line pairs, thereby reducing the efficiency of the bit redundancy by using up all the redundant bit line pairs to fix a single defective bit line pair. Thus, if an array contained two defective bit line pairs that were not located in the same group selected by the A2–A8 address group (i.e., BL8 . . . BL11), then the memory module would require eight redundant bit line pairs for the proper repair (two groups of four redundant bit line pairs).

Figure 4:
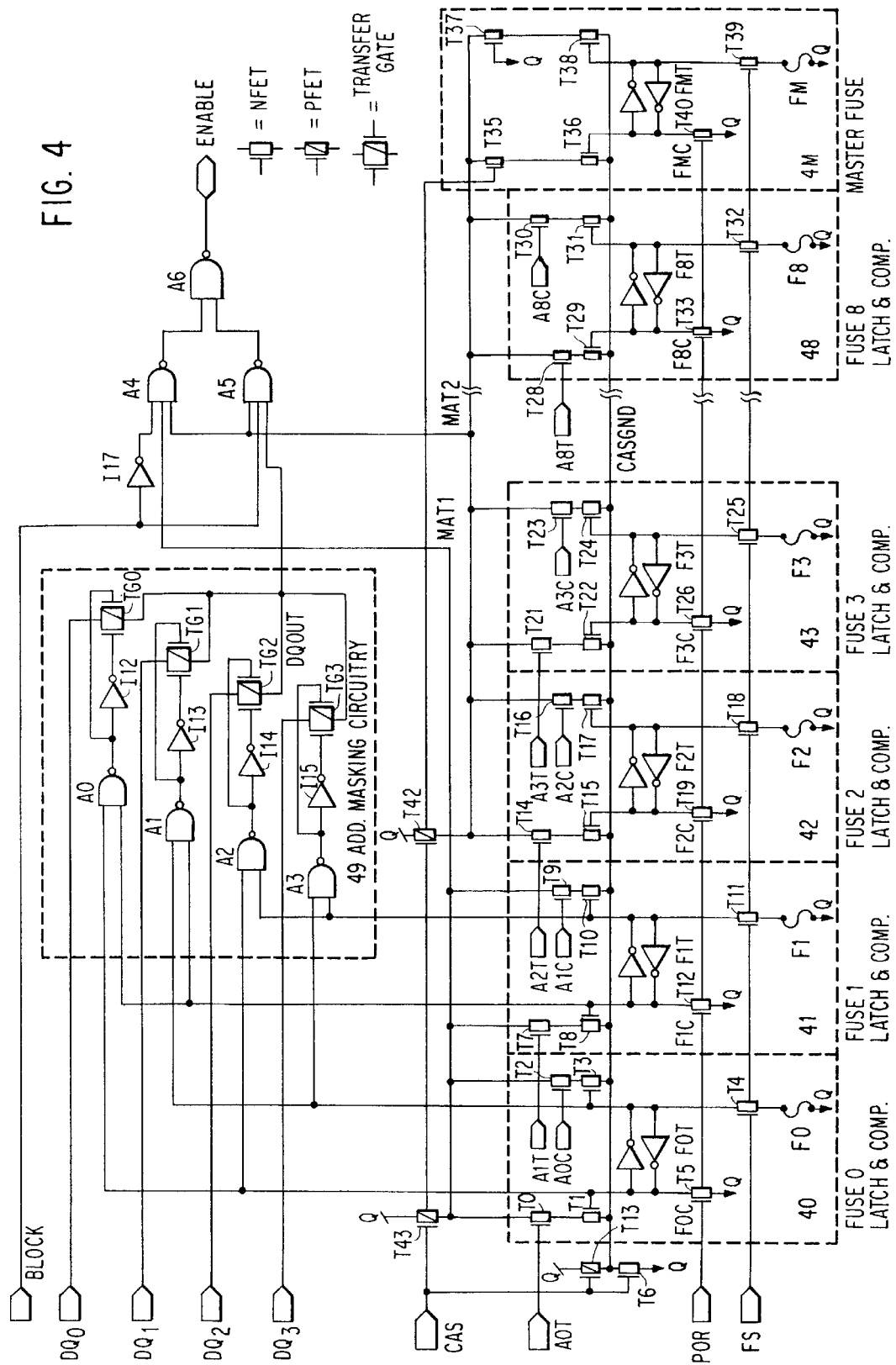
FIG. 4 is a schematic diagram of a redundant decoder according to the present invention.

FIG. 4 depicts the redundant decoder according to the present invention. The redundant decoder incorporates the address masking function into the redundant bit decoder during block write operations and bypasses the masking function during normal read/write memory cycles.

Fuse blocks 40, 41 . . . 48 are used to store the address bits corresponding to the bit line found to be defective. For example, if bit line BL9 were found to be defective, the fuses f0 and F3 corresponding to that address (A0–A8= 100100000) must be blown to store this address. It should be noted that, whenever an address bit is stored in the redundant decoder, the master fuse FM in the master fuse block 4M must also be blown. Normally, the fuses are blown during a testing phase subsequent to the fabrication of the memory module. The normal memory elements and their corresponding bit line pairs are tested for defects. Once the defect is determined, the corresponding address can be stored by blowing the appropriate fuse using techniques well known in the art.

Figure 5:
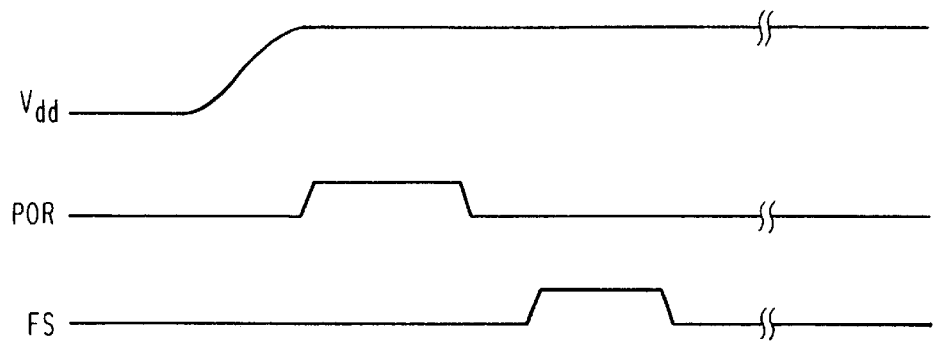
FIG. 5 is a timing diagram of the power-up sequence.

To perfect the programming of the decoder, the following sequence is performed. Power is applied to the module, as shown by $V_{dd}$ in FIG. 5, thereby triggering an internal power-on-reset (POR) signal to go to a high state and turn on transistor switches T5, T12, T19, T26 . . . T33 and T40. These transistors can be N-type field-effect transistors (NFET) having their source nodes connected to ground. When the POR signal activates these transistors, a complementary side of each fuse latch F0C, F1C . . . F8C and FMC is set to zero. As the state of these latches cannot be determined upon power up, the activation of signal POR sets the fuses to a known state. At this point, the true side of each latch F0T, F1T . . . FMT is in a high state. After the POR signal returns to its low state, a fuse set signal (FS), being interlocked with the falling edge of the POR signal, changes to a high state (FIG. 5) which turns on transistors T4, T11, T18, T25 . . . T32 and T39. These transistors are also of the NFET type, and their source nodes are indirectly connected to ground via fuses F0, F1, F2, F3 . . . F8 and FM. During the high state of the FS signal, the true side of each fuse latch FOT, F1T . . . FMT will be reset to zero because the true side will be tied to ground via the corresponding fuse. However, in the instant case where fuses F0, F3 and FM are blown, the true sides of latches F0T, F3T and FMT will remain in the high state. All the other fuses are tied to ground and change to the low state. Accordingly, the complementary side of each changed latch is reset to the high state. Thus, the address of the defective bit line BL9 (A0–A8=100100000) is programmed in the fuse blocks 40–48.

During a normal read/write operation, input address bits A0–A8 and their complements are received by fuse blocks 40–48. For example, address bit A0 will have its true state A0T input to the gate of transistor T0, and its complementary state A0C input to the gate node of transistor T2. As the remaining transistors found in the fuse blocks 40–48 and 4M are of the NFET type, a high state input to the gate node of each transistor will allow the signal appearing at the transistor drain node to pass through to the transistor source node. Thus, a high state appearing on the A0T input would activate transistor T0, thereby connecting signal node MAT1 to the drain node of transistor T1. Node MAT1 will then be connected to node CASGND via transistors T0 and T1 if both the gate inputs A0T and F0C are high.

In the instant case, fuse F0 is blown and the fuse latch complementary side F0C is at a low state; therefore, this connection will not be available. A similar connection may be made in fuse block 41 where the high input states of A1T and F1C would allow node MAT1 to be connected to CASGND through transistors T7 and T8. Analogous connections can be made for node MAT2 to CASGND through fuse blocks 42–48. Nodes MAT1 and MAT2 are initially set to a high state through transistors T43 and T42, respectively, whereas node CASGND is initially set to a high state through transistor T13. These transistors are PFET type transistors which are deactivated by a high input of the column address strobe (CAS). This high input also activates NFET transistor T6 whose source node is connected to ground. Thus, when CAS is high, CASGND is held to a low state.

As described above, during normal operation, the BLOCK signal will be held in a low state, thereby causing a high signal to be output both from inverter I17 and from NAND gate A5. As the address masking circuitry 49 has a sole output DQOUT connected to NAND gate A5, the low state of the BLOCK signal disables any effect the address masking circuitry would have on the output ENABLE signal from NAND gate A6. Thus, it can be seen that a low state appearing on either node MAT1 or node MAT2 will result in a low state ENABLE signal output from NAND gate A6 during normal read/write operations. A high state ENABLE signal will result only from similar high states of nodes MAT1 and MAT2.

It follows from the discussion above that both MAT1 and MAT2 will remain in their original high states if there is a favorable comparison between the input address bits and the address bits stored in fuse blocks 40–48. Thus, in the instant case, a high state for address bits A0T and A3T will result in high states for nodes MAT1 and MAT2, provided that the remaining input address bits (A1, A2, A4 . . . A8) are in a low state. With a favorable comparison, the ENABLE signal will be set to a high state. Accordingly, a non-favorable comparison between the input address bits and the stored address bit will result in either node MAT1 or MAT2 changing to the low state, forcing the ENABLE signal to a low state.

Figure 6A:
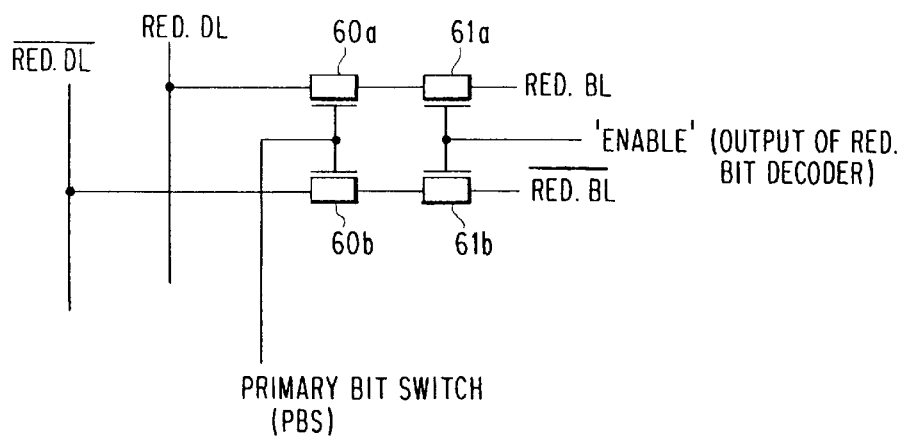
FIG. 6A is a block diagram of a redundant memory element according to the present invention.
Figure 6B:
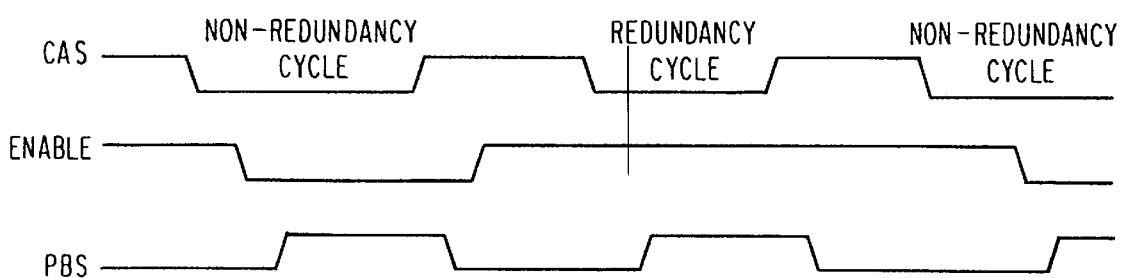
FIG. 6B is a timing diagram depicting the redundancy cycle.

The effect of the ENABLE signal can be seen in FIGS. 6A and 6B. The ENABLE signal is coupled to a pair of bit switches 61a and 61b. A high input state of the ENABLE signal turns on switches 61a and 61b so that the information on redundant bit line pair REDBL can be transmitted to the redundant data line pair REDDL via bit switches 60a and 60b, respectively. The latter bit switches are controlled by the input signal primary bit switch (PBS). The PBS signal is a clock signal generated from CAS that is used to perform the first level of column address decoding. In particular, the module is operative to output information through the parallel port during a high state of the PBS signal. Thus, when the PBS signal is low, no information is transmitted from an addressed bit line pair to the data line pair. Accordingly, no information transmitted over redundant bit line pair REDBL should be transmitted to redundant data line pair REDDL. As shown in FIG. 6B, when PBS and ENABLE signals are both in the high states, a redundancy cycle has occurred, and the selected redundant bit line pair REDBL will transfer its information to the redundant data line pair REDDL. In the instant case, the defective bit line pair BL9, whose address was programmed into the redundant decoder described above, can be replaced by the redundant bit line is pair REDBL shown in FIG. 6A during the high states of both the ENABLE and the PBS signals, thereby allowing the substitution of a single redundant bit line pair for a single defective bit line pair.

With reference to FIG. 4, a block write operation is activated when the BLOCK signal is in a high state, thereby causing the output of inverter I17 to go low, and forcing a high state signal to be output from NAND gate A4. In so doing, the control of the ENABLE signal state will be from the output of NAND gate A5. This output will be determined by the states of node DQOUT and node MAT2. More specifically, a high state appearing on node DQOUT and node MAT2 will result in the ENABLE signal having a high state. If either of the two nodes is in a low state, then the ENABLE signal will be in a low state. As described above, the state of the ENABLE signal is significant in that it allows the redundant bit line pair REDBL to be connected to the redundant data line pair REDDL (FIG. 6A) when the PBS signal is high.

As previously discussed, during a block write operation, only address bits A2–A8 are used to select a group of memory elements and their corresponding bit line pairs. These address bits are input to the redundant decoder; more particularly, the address bits are input to fuse blocks 42–48. A favorable match between the input address bits and the stored address bits results in a high state for node MAT2. It should be noted that the input address bits A0 and A1 and their effects on node MAT1 are not material to the change in state of the ENABLE signal during block write operation. However, the stored address bits corresponding to input address bits A0 and A1 are used by the address masking circuitry 49 to control the state of node DQOUT, but there is no effect on the state of the ENABLE signal, as discussed above.

More specifically, the true side of the fuse latch F0T is connected to NAND gates A1 and A3. The complementary side F0C of the fuse latch is connected to the input of NAND gates A0 and A2. The true side of the fuse latch F1T is connected to one input of NAND gates A2 and A3. The complementary side of the fuse latch F1C is connected to one input of NAND gates A0 and A1. In the instant case, where fuse latch F0 has been blown to store the address of the defective bit line BL9, a high state input (F0T=1) is presented to the inputs of NAND gates A1 and A3, whereas a low state signal (F0C=0) is input to NAND gates A0 and A2. Similarly, the F1 fuse has not been blown, thereby causing a low state input (F1T=0) to be present at NAND gates A2 and A3, whereas a high state (F1C=1) is input to NAND gates A0 and A1. This condition causes the NAND gates A0, A2 and A3 to output a high state signal, which has the effect of forcing the inverters I12, I14 and I15 to output a low state signal, thereby deactivating the transfer gates TG0, TG2 and TG3. However, the NAND gate A1 outputs a low state signal which causes the inverter I13 to activate the transfer gate TG1. As can be seen from FIG. 4, transfer gate TG1 allows the input DQ1 to control the state of node DQOUT.

As discussed earlier, the input data line DQ1 controls the write operation to the bit line pair normally decoded when input address bits A0 and A1 are in a high state and a low state, respectively. This operation is significant because the input data lines DQ0 . . . DQ3 are used to select which bit line pairs are to be connected to the data line pairs during block write operation, as discussed above. Thus, it can be seen that the storage of the least significant bits A0 and A1 of the defective bit line pair allows the corresponding data input DQ0 . . . DQ3 to control the state of node DQOUT. For the instant case, the data line DQ1 controls the output state of node DQOUT which, in turn, controls the state of the ENABLE signal when a favorable comparison is found between input address bits A2–A8 and the stored address bits.

Figure 7:
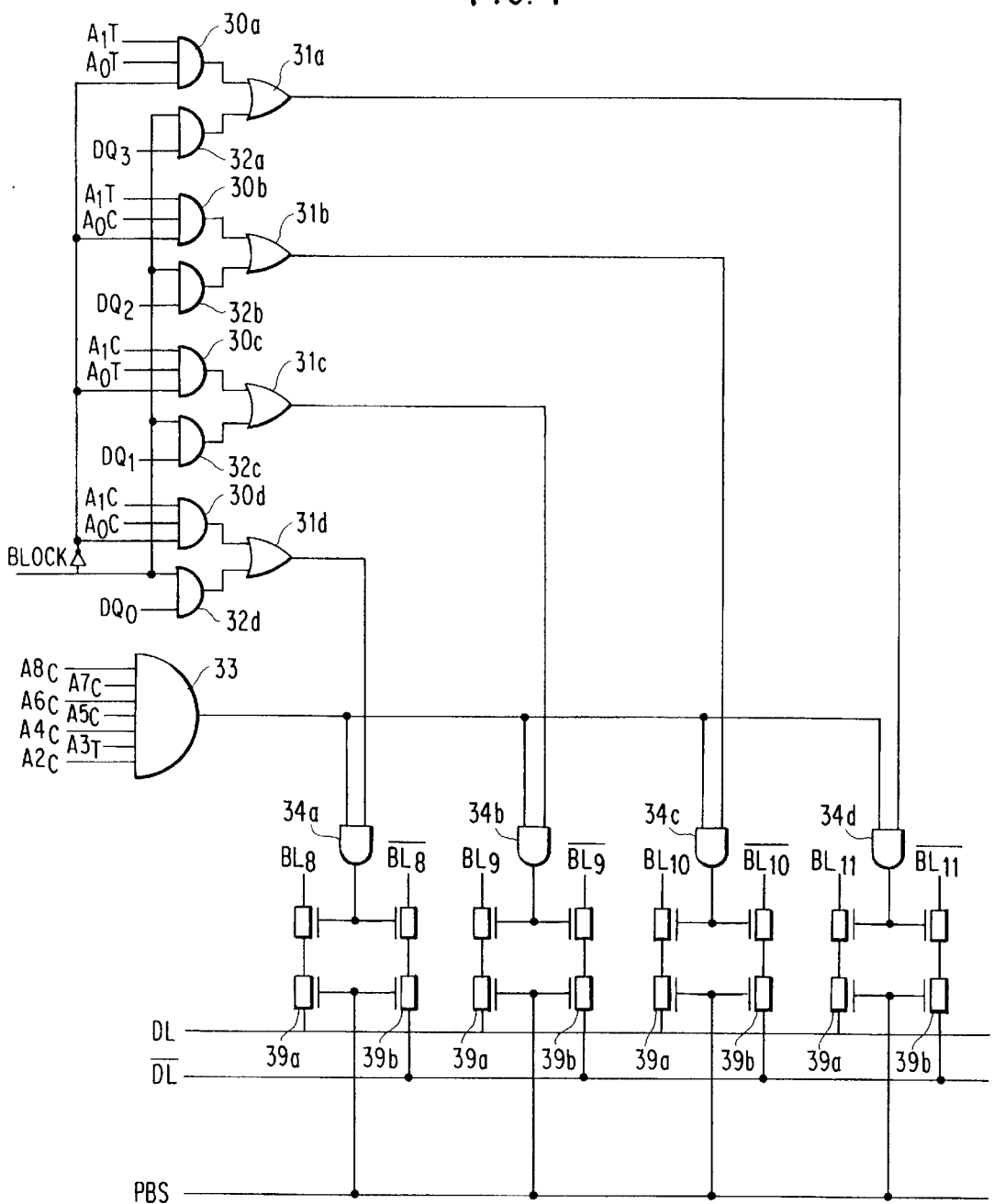
FIG. 7 is a schematic depicting four adjacent bit lines selected during block write operation.

FIG. 7 depicts four adjacent bit line pairs selected during block write operation. As can be seen, bit line pairs BL8 . . . BL11 are selected by address bits A2C, A3T and A4C . . . A8C in a manner similar to that shown in FIG. 3. Indeed, FIGS. 3 and 7 are substantially identical except for the presence of the bit switches 39a,b and the absence of the redundant circuit elements 35, 36a . . . 36d and 38a,b The operation of the FIG. 7 circuit during block write operation is similar to that of FIG. 3 without the redundancy. According to the present invention, there is no longer a need for a block of redundant bit line pairs. A single redundant bit line pair (FIG. 6A) may be provided to replace any bit line pair of the group of bit line pairs selected. In particular, if bit line BL9 (FIG. 7) is found to be defective, a favorable comparison in the redundant decoder of the invention will change the ENABLE signal to a high state, thereby allowing the redundant bit line pair REDBL (FIG. 6A) to be substituted for bit line pair BL9 when the PBS signal is high. However, if the address mask 12 (FIG. 1) has a data input DQ1=0 (corresponding to bit line pair BL9), thereby inhibiting the write operation to the bit line pair BL9, there the address masking circuitry 49 will detect a low state in DQ1 and cause the node DQOUT to be in a low state. Thus, the ENABLE signal will become low, thereby disabling the bit switches 61a and 61b of the redundant circuitry.

The redundant decoder disclosed herein saves significant fabrication area compared to previous redundant bit line implementation and has no impact on the performance of a block write or normal read/write operations. The preferred embodiment of the decoder as described above is for a 4×4 block write operation (writing data into a group of four memory elements in each of four sections of a memory module); however, it should be noted that the architecture can be expanded to 8×8 or 16×16 block write operations. The decoder described above can be implemented with virtually no additional fabrication area, as compared to standard redundant bit decoders, and does not sacrifice the redundant bit line efficiency of standard random access memory schemes.

What is claimed is:

1. A redundancy decoder, comprising:
   a plurality of address inputs;
   a plurality of address mask inputs;
   a plurality of stored redundant address bits;
   first means for comparing all of said plurality of stored redundant address bits to respective ones of said plurality of address inputs during a first access mode, and for comparing fewer than all of said plurality of stored redundant address bits to respective ones of said plurality of address inputs during a second access mode; and
   second means for using remaining ones of said plurality of stored redundant address bits to select one of said plurality of address mask inputs during said second access mode.

2. The redundancy decoder of claim 1 further comprising means for generating an output enable signal in response to a comparison by said first means.

3. The redundancy decoder of claim 2, further comprising inhibiting means for selectively inhibiting the generation of said output enable signal in response to comparisons by said second means so that writing to a redundant bit line is inhibited.

4. The redundancy decoder of claim 3, further comprising means for receiving a block write input signal signifying a block write operation which allows a plurality of bit lines to be accessed simultaneously, and wherein said inhibiting means is operative only in accordance with said block write input signal.

5. A memory module for accessing memory lines associated with input address bits and input mask bits, said module comprising:
   a plurality of bit lines accessed by input address bits;
   address mask means for receiving input mask bits and disabling, in accordance with said mask bits, selected ones of said bit lines to prevent storing new data;
   redundancy decoder means for comparing input address bits to stored redundant address bits, and for using said stored redundant address bits to select said input mask bits, said redundancy decoder means generating an output enable signal; and
   redundant bit line means for replacing a detective bit line in response to said output enable signal.

6. The memory module of claim 5, wherein said redundancy decoder means further comprises inhibiting means for selectively inhibiting the generation of said output enable signal in accordance with said input mask bits.

7. The memory module of claim 6, further comprising means for receiving a block write input signal signifying a block write operation which allows a plurality of bit lines to be accessed simultaneously, and wherein said inhibiting means is operative only in accordance with said block write input signal.

8. The memory module of claim 5, wherein said redundancy decoder means further comprises means for generating said output enable signal in response to a comparison between said input address bits and said stored redundant address bits.

9. A memory module for accessing memory lines associated with input address bits and input mask bits, said module comprising:
   a plurality of bit lines accessed by input address bits;
   address mask means for receiving input mask bits and disabling selected ones of said bit lines to prevent storing new data in accordance with said mask bits;

redundancy decoder means for comparing input address bits to stored redundant address bits, and for using said stored redundant address bits to select said input mask bits, said redundancy decoder means generating an output enable signal; wherein said redundancy decoder means further comprising inhibiting means for selectively inhibiting the generation of said output enable signal in accordance with said input mask bits, and means for generating said output enable signal in response to a comparison between said input address bits and said stored redundant address bits;

redundant bit line means for replacing a defective bit line in response to said output enable signal; and means for receiving a block write input signal signifying a block write operation which allows a plurality of bit lines to be accessed simultaneously, and wherein said inhibiting means is operative only in accordance with said block write input signal.

10. A method of accessing memory lines in a memory module used for storing data associated with input address bits and input mask bits, said method comprising the steps of:

accessing a plurality of bit lines by using said input address bits;

receiving said input mask bits and disabling, in according with said mask bits, selected ones of said bit lines to prevent storing new data;

comparing said input address bits to stored redundant address bits, and using said stored redundant address bits to select said input mask bits;

generating an output enable signal in response to a comparison between said input address bits and said stored redundant address bits;

selectively inhibiting the generation of said output enable signal in accordance with said input mask bits;

replacing a defective bit line in response to said output enable signal; and receiving a block write input signal signifying a block write operation which allows a plurality of bit lines to be accessed simultaneously, wherein said inhibiting step is operative only in accordance with said block write input signal.

11. A memory system comprising:

means for performing a block write mode that accesses a block of bit lines simultaneously using a block address of m bits and for performing a single bit line write mode using a line address of n bits, wherein m and n are integers and m is less than n, and wherein plural memory elements are accessed per each bit line of the accessed block of bit lines during block write mode; and means for substituting a redundant bit line for one of said bit lines that is faulty, within said accessed block, without also substituting redundant bit lines for remaining ones of said bit lines within said accessed block that are not faulty.

12. The memory system as claimed in claim 11, wherein said block write mode accesses a block of up to N×N memory elements, N being an integer greater than 1.

13. A memory system comprising:

a plurality of word lines and bit lines of interconnected memory elements, the memory system being operated in a first write mode in which a selected one of said plurality of bit lines is accessed at one time, and a second write mode in which a selected block of said plurality of bit lines is accessed at one time and in which a plurality of memory elements are accessed per each bit line of the accessed block of bit lines during the second write mode; and a redundancy system that substitutes a redundant bit line for said selected one of said plurality of bit lines accessed in said first write mode should it be faulty, and substitutes a redundant bit line for a faulty one of said bit lines within said selected block of said plurality of bit lines accessed in said second write mode should it be faulty, without substituting for remaining ones of said bit lines within said selected block of said plurality of bit lines that are not faulty.

* * * * *